(12) United States Patent
Jin et al.

(10) Patent No.: US 10,530,310 B2
(45) Date of Patent: Jan. 7, 2020

(54) DIGITAL PRE-DISTORTION FOR AN AB AMPLIFIER

(71) Applicant: Cisco Technology, Inc., San Jose, CA (US)

(72) Inventors: Hang Jin, Plano, TX (US); John T. Chapman, Coto de Caza, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/957,061

(22) Filed: Apr. 19, 2018

(65) Prior Publication Data

US 2019/0326861 A1    Oct. 24, 2019

(51) Int. Cl.
| | |
|---|---|
| *H03F 1/32* | (2006.01) |
| *H03F 1/56* | (2006.01) |
| *H03F 3/19* | (2006.01) |
| *H03F 3/21* | (2006.01) |
| *H04B 1/04* | (2006.01) |

(52) U.S. Cl.
CPC ............ *H03F 1/3247* (2013.01); *H03F 1/56* (2013.01); *H03F 3/19* (2013.01); *H03F 3/21* (2013.01); *H03F 2200/129* (2013.01); *H03F 2200/222* (2013.01); *H03F 2200/387* (2013.01); *H03F 2200/451* (2013.01); *H03F 2201/3215* (2013.01); *H04B 1/0475* (2013.01)

(58) Field of Classification Search
USPC .................... 330/149, 291; 375/296–297
See application file for complete search history.

(56) References Cited

U.S. PATENT DOCUMENTS

| | | | |
|---|---|---|---|
| 7,109,792 B2* | 9/2006 | Leffel | H03F 1/3247 330/149 |
| 2004/0171358 A1* | 9/2004 | Karjalainen | H03F 1/3247 455/126 |
| 2004/0232985 A1* | 11/2004 | Itahara | H03F 1/3223 330/149 |
| 2012/0286985 A1* | 11/2012 | Chandrasekaran | H03F 1/3247 341/144 |

* cited by examiner

*Primary Examiner* — Hieu P Nguyen
(74) *Attorney, Agent, or Firm* — Merchant & Gould P.C.

(57) ABSTRACT

Digital pre-distortion may be provided. First, a radio frequency (RF) domain distortion correcting signal and a base band (BB) domain distortion correcting signal may be initialized. Then the RF domain distortion correcting signal may be generated from an input signal. The generated RF domain distortion correcting signal may correspond to an amplifier. Next, the BB domain distortion correcting signal may be generated from the input signal. The generated BB domain distortion correcting signal may correspond to the amplifier. Then the RF domain distortion correcting signal and the BB domain distortion correcting signal may be combined to form a hybrid distortion correcting signal. The hybrid distortion correcting signal may then be provided to input matching circuitry feeding the amplifier.

20 Claims, 6 Drawing Sheets

DIGITAL PRE-DISTORTION FOR AN AB AMPLIFIER

TECHNICAL FIELD

The present disclosure relates generally to distortion correction.

BACKGROUND

A Hybrid Fiber-Coaxial (HFC) network is a broadband network that combines optical fiber and coaxial cable. It has been commonly employed globally by cable television operators. In a hybrid fiber-coaxial cable network, television channels are sent from a cable system's distribution facility to local communities through optical fiber trunk lines. At the local community, a box translates the signal from a light beam to electrical signal, and sends it over cable lines for distribution to subscriber residences. The optical fiber trunk lines provide adequate bandwidth to allow future expansion and new bandwidth-intensive services.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
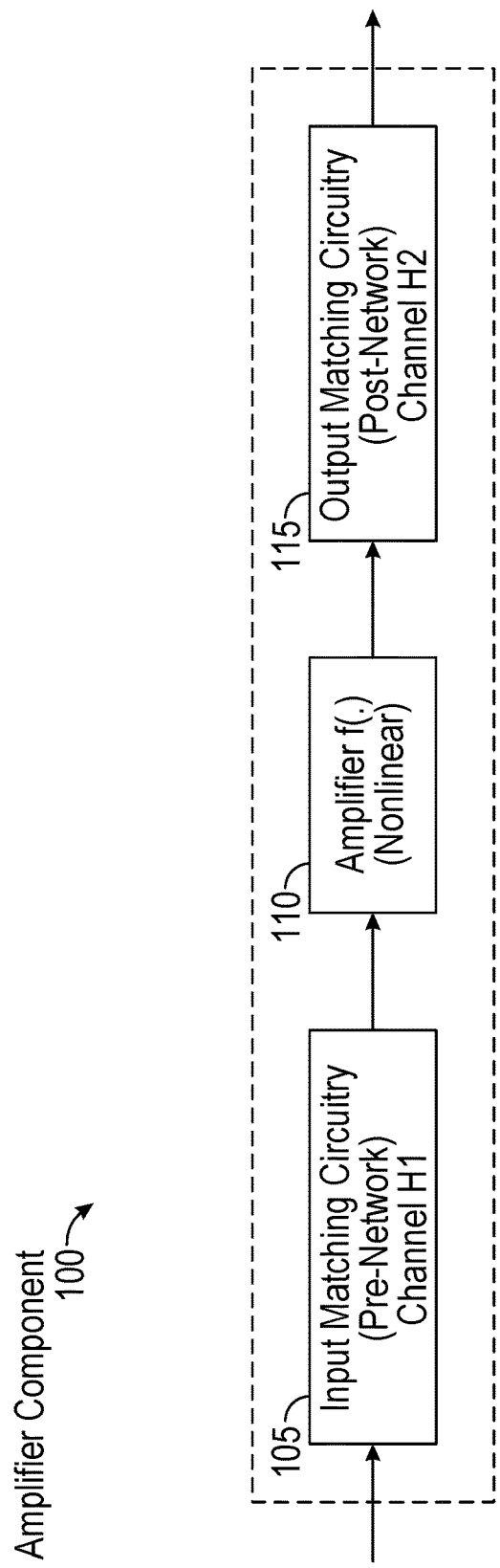
FIG. 1 is a block diagram of an amplifier component.

Digital pre-distortion may be provided. First, a radio frequency (RF) domain distortion correcting signal and a base band (BB) domain distortion correcting signal may be initialized. Then the RF domain distortion correcting signal may be generated from an input signal. The generated RF domain distortion correcting signal may correspond to an amplifier. Next, the BB domain distortion correcting signal may be generated from the input signal. The generated BB domain distortion correcting signal may correspond to the amplifier. Then the RF domain distortion correcting signal and the BB domain distortion correcting signal may be combined to form a hybrid distortion correcting signal. The hybrid distortion correcting signal may then be provided to input matching circuitry feeding the amplifier.

Both the foregoing overview and the following example embodiments are examples and explanatory only, and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Multiple-system operators (MSOs) are operators of multiple cable or direct-broadcast satellite television systems. These systems may include HFC networks. To amplify upstream (US) signals and downstream (DS) signals in the HFC network, MSOs may use nodes deployed within the HFC. In the HFC network, a node may comprise a container that may house optical and electrical circuitry. An optical fiber cable or a coaxial cable may be connected to an US side of the node and a plurality of coaxial cables may be connected to a DS side of the node. The US side of the node may be connect to a headend in the HFC network and the DS side of the node may be connected to Customer Premises Equipment (CPE) of subscribers to the HFC. An amplifier may be used in the node to amplify upstream (US) signals and downstream (DS) signals.

The amplifier used in conventional systems may comprise a Class-AB amplifier. A Class-AB amplifier may have >10% power efficiency, but may have high non-linearity. Embodiments of the disclosure may provide a process to correct the non-linearity of a Class-AB amplifier in order for it to be used, for example, in an HFC network to achieve better power efficiency. Embodiments of the disclosure may improve the amplifier's power efficiency, for example, by pre-distorting a radio frequency (RF) signal and a Base Band (BB) signal to compensate for the Class-AB amplifier's non-linearity so that the Class-AB amplifier may be overdrive or to reduce the Class-AB amplifier's bias to improve the Class-AB amplifier's power efficiency.

FIG. 1 is a block diagram of an amplifier component 100. As shown in FIG. 1, amplifier component 100 may comprise input matching circuitry 105, an amplifier 110, and output matching circuitry 115. Input matching circuitry 105 may comprise any circuitry used to match an input source to a node comprising amplifier component 100. For example, if the input comprises a 50 ohm or 75 ohm coaxial cable, input matching circuitry 105 may match the input 50 ohm or 75 ohm coaxial cable.

Figure 2B:
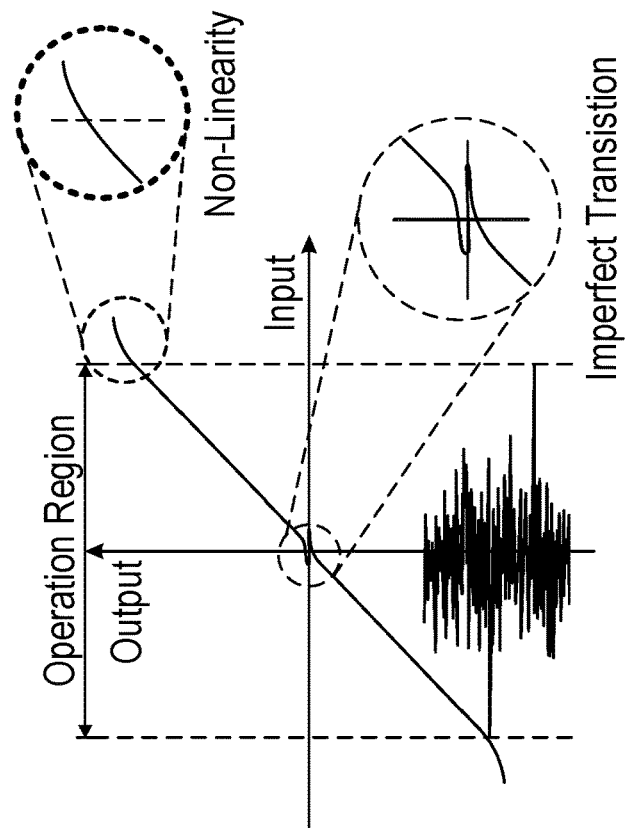
FIG. 2B is diagram illustrating an imperfect transition of a Class-AB amplifier.
Figure 2A:
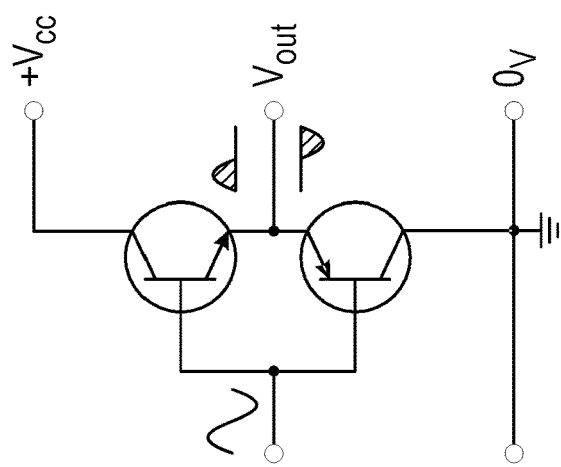
FIG. 2A is diagram illustrating a Class-AB amplifier.

Amplifier 110 may comprise, but is not limited to, a Class-AB amplifier as shown in FIG. 2A. In a Class-AB amplifier, the conduction angle may intermediate between Class A and B; the two active elements (e.g., transistors) may conduct more than half of the time. In Class-AB operation, each active element may operate the same way as in Class B over half the waveform, but also may conduct a small amount on the other half. As a result, the region where both devices simultaneously are nearly off (i.e., the "dead zone") is reduced. The result may be that when the waveforms from the two devices are combined, the crossover is greatly minimized or eliminated altogether. A Class-AB amplifier may have close-to-zero bias (i.e., little quiescent current) and can be over driven into the saturation region.

Figure 3A:
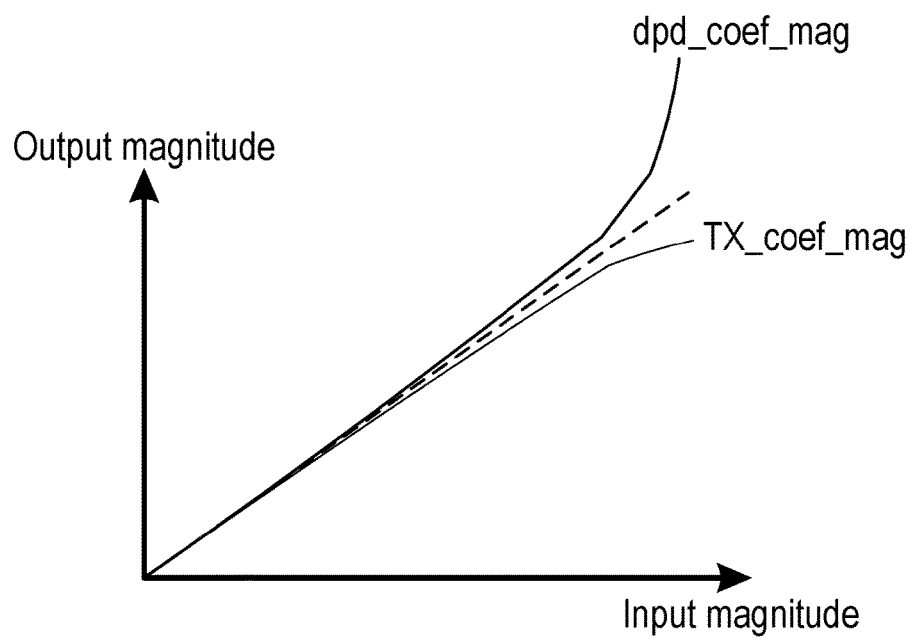
FIG. 3A shows digital pre-distortion for the Base Band magnitude.
Figure 3B:
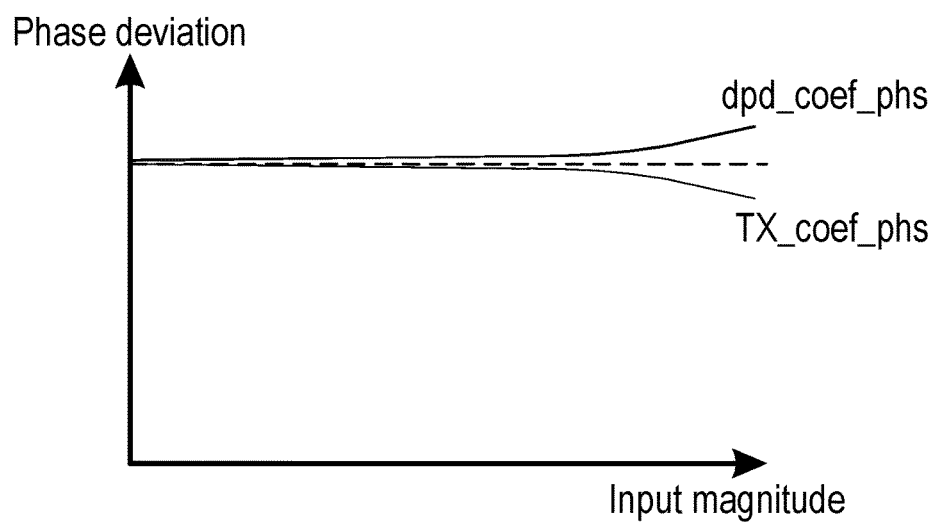
FIG. 3B shows digital pre-distortion for the Base Band phase.

FIG. 2B illustrates the imperfect transition region between the two active elements in the Class-AB amplifier's operating range. Embodiments of the disclosure may use Digital pre-distortion (DPD) to provide a process to correct the non-linearity of a Class-AB amplifier in this imperfect transition region. Distortion can be characterized with the gain variation with input signal level (e.g., real value). DPD may invert these variations at the input. As described in greater detail below, embodiments of the disclosure may provide a hybrid DPD process, for example, by combining RF and BB DPD processes. FIG. 3A and FIG. 3B illustrate BB DPD for the Class-AB amplifier. FIG. 3A shows DPD for the BB magnitude and FIG. 3B shows DPD for the BB phase.

Turning back to FIG. 1, similar to input matching circuitry 105, output matching circuitry 115 may comprise any circuitry used to match an output source to the node comprising amplifier component 100. For example, if the output comprises a 50 ohm or 75 ohm coaxial cable, output matching circuitry 115 may match the output 50 ohm or 75 ohm coaxial cable.

Figure 4:
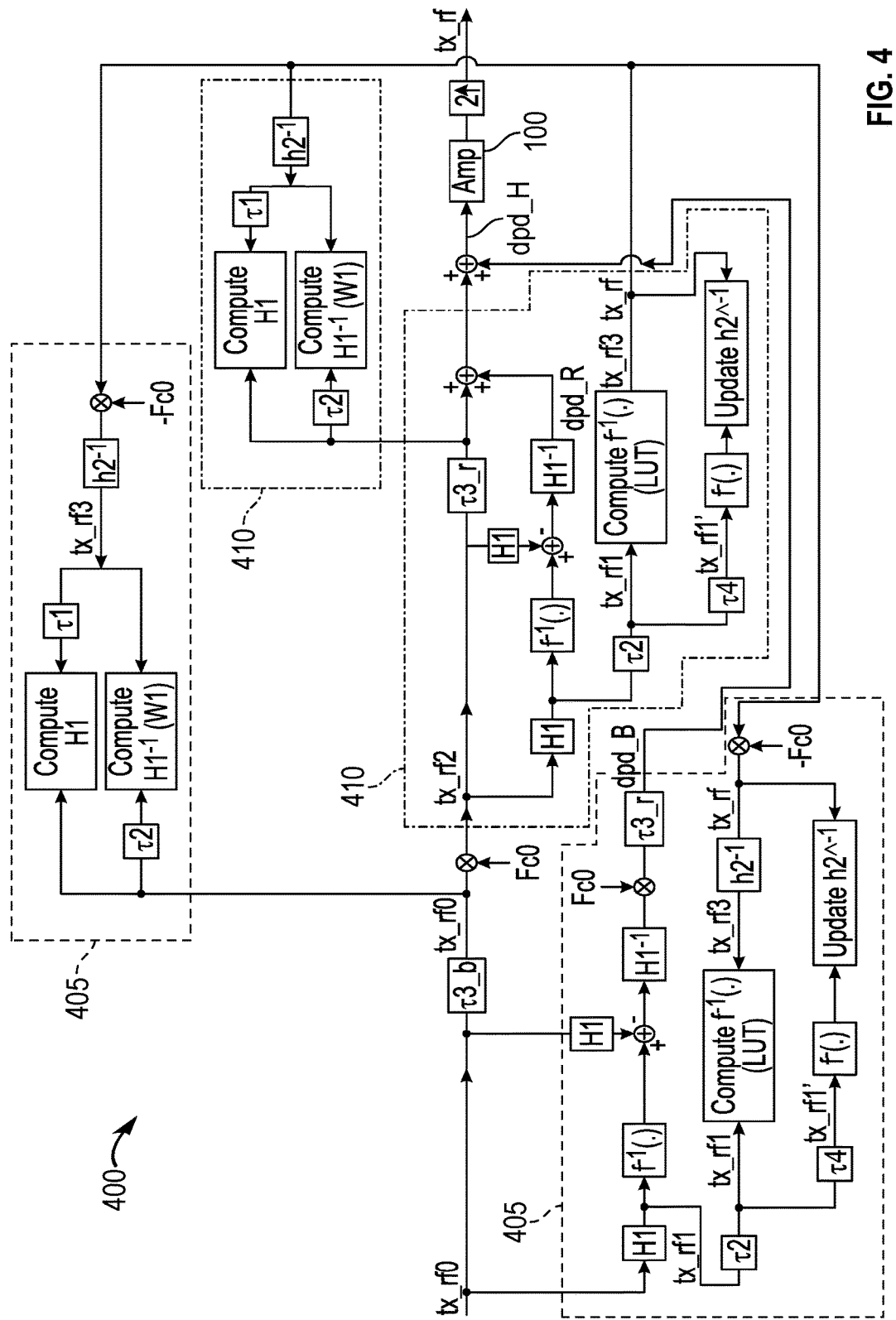
FIG. 4 is a block diagram of a hybrid digital pre-distortion system.

FIG. 4 is a block diagram of a digital pre-distortion system 400 for providing digital pre-distortion consistent with embodiments of the disclosure. As shown in FIG. 4, digital pre-distortion system 400 may comprise amplifier component 100, a Base Band Digital Pre-Distortion actuator 405, and a Radio Frequency Digital Pre-Distortion actuator 410. While the same labels may be used for blocks, signals, and variables within both the BB domain (e.g., Base Band Digital Pre-Distortion actuator 405) and the RF domain (e.g., Radio Frequency Digital Pre-Distortion actuator 410) these blocks, signals, and variables are unique to their respective domains.

Base Band Digital Pre-Distortion actuator 405 may comprise a plurality of base band digital pre-distortion actuator elements. While FIG. 4 shows a plurality of separate elements comprising Base Band Digital Pre-Distortion actuator 405, these elements and the functionality of these elements may be combined or separated in any way. Each of these elements in Base Band Digital Pre-Distortion actuator 405 may be embodied in hardware and/or in software (including firmware, resident software, micro-code, etc.) or in any other circuits or systems. For example, each of the plurality of base band digital pre-distortion actuator elements in FIG. 4 may be practiced in an electrical circuit comprising discrete electronic elements, packaged or integrated electronic chips containing logic gates, a circuit utilizing a microprocessor, or on a single chip containing electronic elements or microprocessors. Furthermore, each of the plurality of base band digital pre-distortion actuator elements in FIG. 4 may also be practiced using other technologies capable of performing logical operations such as, for example, AND, OR, and NOT, including but not limited to, mechanical, optical, fluidic, and quantum technologies. In addition, each of the plurality of base band digital pre-distortion actuator elements in FIG. 4 may be practiced in a computing device 600 as described in greater detail below with respect to FIG. 6.

Radio Frequency Digital Pre-Distortion actuator 410 may comprise a plurality of radio frequency digital pre-distortion actuator elements. While FIG. 4 shows a plurality of separate elements comprising Radio Frequency Digital Pre-Distortion actuator 410, these elements and the functionality of these elements may be combined or separated in any way. Each of these elements in Radio Frequency Digital Pre-Distortion actuator 410 may be embodied in hardware and/or in software (including firmware, resident software, micro-code, etc.) or in any other circuits or systems. For example, each of the plurality of radio frequency digital pre-distortion actuator elements in FIG. 4 may be practiced in an electrical circuit comprising discrete electronic elements, packaged or integrated electronic chips containing logic gates, a circuit utilizing a microprocessor, or on a single chip containing electronic elements or microprocessors. Furthermore, each of the plurality of radio frequency digital pre-distortion actuator elements in FIG. 4 may also be practiced using other technologies capable of performing logical operations such as, for example, AND, OR, and NOT, including but not limited to, mechanical, optical, fluidic, and quantum technologies. In addition, each of the plurality of radio frequency digital pre-distortion actuator elements in FIG. 4 may be practiced in a computing device 600 as described in greater detail below with respect to FIG. 6.

Figure 5:
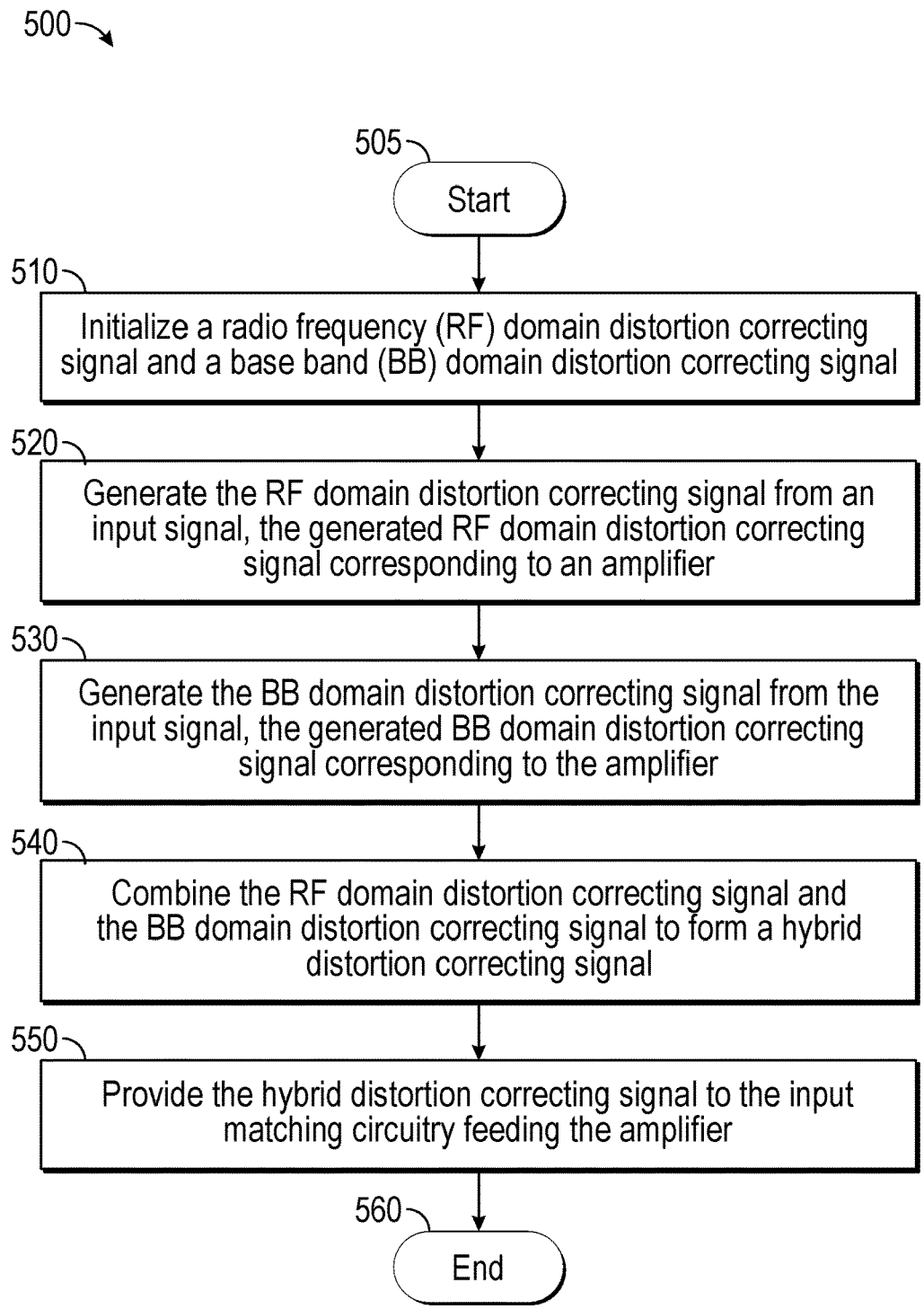
FIG. 5 is a flow chart of a method for providing digital pre-distortion.

FIG. 5 is a flow chart setting forth the general stages involved in a method 500 consistent with an embodiment of the invention for providing digital pre-distortion. Method 500 may be implemented using Base Band Digital Pre-Distortion actuator 405 and a Radio Frequency Digital Pre-Distortion actuator 410 as described in more detail above with respect to FIG. 4. Method 500 may provide a hybrid DPD process by combining RF and BB DPD processes. Ways to implement the stages of method 500 will be described in greater detail below.

Method 500 may begin at starting block 505 and proceed to stage 510 where Radio Frequency Digital Pre-Distortion actuator 410 and Base Band Digital Pre-Distortion actuator 405 may respectively initialize a radio frequency (RF) domain distortion correcting signal (i.e., dpd_R) and a base band (BB) domain distortion correcting signal (i.e., dpd_B). For example, Radio Frequency Digital Pre-Distortion actuator 410 may set dpd_R=1 and Base Band Digital Pre-Distortion actuator 405 may set dpd_B=1.

From stage 510, where Radio Frequency Digital Pre-Distortion actuator 410 and Base Band Digital Pre-Distortion actuator 405 respectively initialize the radio frequency (RF) domain distortion correcting signal (i.e., dpd_R) and the base band (BB) domain distortion correcting signal (i.e., dpd_B), method 500 may advance to stage 520 where Radio Frequency Digital Pre-Distortion actuator 410 may generate the RF domain distortion correcting signal (i.e., dpd_R) from an input signal. The generated RF domain distortion correcting signal may correspond to amplifier 110. For example, Radio Frequency Digital Pre-Distortion actuator 410 may perform an iterative process to find amplifier 110's non-linearity (i.e., f(.)) in the RF domain and the characterization (i.e., H1) in the RF domain for input matching circuitry 105, so Radio Frequency Digital Pre-Distortion actuator 410 may cancel out f(.) in the RF domain. As stated above, while the same labels may be used for blocks, signals, and variables within both the BB domain (e.g., Base Band Digital Pre-Distortion actuator 405) and the RF domain (e.g., Radio Frequency Digital Pre-Distortion actuator 410) these blocks, signals, and variables are unique to their respective domains.

Embodiments of the disclosure may perform an RF DPD process (i.e., inner loop of FIG. 4) to generate the updated the RF domain distortion correcting signal (i.e., dpd_R) and t3_r. This stage (e.g., stage 520) may be repeated multiple iterations (e.g., two iterations) to compute $H2^{-1}$. As shown in FIG. 4, tx_rf1 in the RF domain may equal the convolution of tx_rf2 and H1 (e.g., Conv (tx_rf2, H1)). To obtain tx_rf0', tx_rf0' may equal tx_rf0(t−t3) (i.e., delay tx_rf0 by t3). To obtain H1, tx_rf2 may be used as the reference and tx_rf as the observation. For example, t1 may be selected so the observation may be delayed by 16 samples with respect to the reference. In the RF domain, to obtain $H^{-1}$, tx_rf may be used as the reference and tx_rf2 may be used as the observation. For example, t2 may be selected so the observation may be delayed by 16 samples with respect to the reference and t3 may equal t1+t2. Coefficients in the RF domain for $f^1(.)$ and W may be obtained by using tx_rf1 as the reference and tx_rf as the observation. For example, t4 may be selected so the observation may be delayed by 16 samples with respect to the reference (e.g., the number of the taps in reference may be 36). So the RF domain process in FIG. 4 may be to: i) compute H1, $H1^{-1}$, and t3; ii) compute W and coefficients for $f^{-1}(.)$ based on the computed H1, $H1^{-1}$; and t3; iii) repeat i) and ii).

Consistent with embodiments of the disclosure, in the RF domain W may be a computed version of H1 (i.e., the characterization for input matching circuitry 105). Then digital pre-distortion system 400 may compute, for the RF domain, digital pre-distortion coefficients for $f(.)^{-1}$ from tx_rf1 and tx_rf. These coefficients may be updated at each iteration in a Look Up Table (LUT) defining $f(.)^{-1}$ in the RF domain.

Once Radio Frequency Digital Pre-Distortion actuator 410 generates the RF domain distortion correcting signal from an input signal in stage 520, method 500 may continue to stage 530 where Base Band Digital Pre-Distortion actuator 405 may generate the BB domain distortion correcting signal (i.e., dpd_B) from the input signal. The generated BB domain distortion correcting signal may correspond to amplifier 110. For example, Base Band Digital Pre-Distortion actuator 405 may perform an iterative process to find amplifier 110's non-linearity (i.e., f(.)) in the BB domain and the characterization (i.e., H1) in the BB domain for input matching circuitry 105, so Base Band Digital Pre-Distortion actuator 405 may cancel out f(.) in the BB domain. As stated above, while the same labels may be used for blocks, signals, and variables within both the BB domain (e.g., Base Band Digital Pre-Distortion actuator 405) and the RF domain (e.g., Radio Frequency Digital Pre-Distortion actuator 410) these blocks, signals, and variables are unique to their respective domains.

Embodiments of the disclosure may run an BB DPD process (i.e., outer loop of FIG. 4) to generate the updated the BB domain distortion correcting signal (i.e., dpd_B) and t3_r. This stage (i.e., stage 530) may be repeated multiple iterations (e.g., two iterations) to compute $H2^{-1}$. As shown in FIG. 4, tx_rf1 may equal the convolution of tx_rf2 and H1 (e.g., Cony (tx_rf2, H1)). To obtain tx_rf0', tx_rf0' may equal tx_rf0(t−t3) (i.e., delay tx_rf0 by t3). To obtain H1, tx_rf2 may be used as the reference and tx_rf as the observation. For example, t1 may be selected so the observation may be delayed by 16 samples with respect to the reference. To obtain $H^{-1}$, tx_rf may be used as the reference and tx_rf2 may be used as the observation. For example, t2 may be selected so the observation may be delayed by 16 samples with respect to the reference and t3 may equal t1+t2. Coefficients for $f^1(.)$ and W may be obtained by using tx_rf1 as the reference and tx_rf as the observation. For example, t4 may be selected so the observation may be delayed by 16 samples with respect to the reference (e.g., the number of the taps in reference may be 36). So the BB domain process in FIG. 4 may be to: i) compute H1, $H1^{-1}$, and t3; ii) compute W and coefficients for $f^{-1}(.)$ based on the computed H1, $H1^{-1}$; and t3; iii) repeat i) and ii).

Consistent with embodiments of the disclosure, in the BB domain W may be a computed version of H1 (i.e., the characterization for input matching circuitry 105). Then digital pre-distortion system 400 may compute, for the BB domain, digital pre-distortion coefficients for $f(.)^{-1}$ from tx_rf1 and tx_rf. These coefficients may be updated at each iteration in a Look Up Table (LUT) defining $f(.)^{-1}$ in the BB domain.

After Base Band Digital Pre-Distortion actuator 405 generates the BB domain distortion correcting signal from the input signal in stage 530, method 500 may proceed to stage 540 where digital pre-distortion system 400 may combine the RF domain distortion correcting signal and the BB domain distortion correcting signal to form a hybrid distortion correcting signal (i.e., dpd_H). For example, as shown in FIG. 4, Radio Frequency Digital Pre-Distortion actuator 410 may add the radio frequency (RF) domain distortion correcting signal (i.e., dpd_R) to the input signal (e.g., tx_rf0) and then Base Band Digital Pre-Distortion actuator 405 may add in the BB domain distortion correcting signal (i.e., dpd_B). As such, digital pre-distortion system 100 may create the dpd_H signal that that may be added into the input of digital pre-distortion system 400.

From stage 540, where digital pre-distortion system 400 combines the RF domain distortion correcting signal and the BB domain distortion correcting signal to form the hybrid distortion correcting signal, method 500 may advance to stage 550 where digital pre-distortion system 400 may provide the hybrid distortion correcting signal to input matching circuitry 105 feeding amplifier 110. For example, the generated hybrid distortion correcting signal (i.e., dpd_H) may be added into the input of digital pre-distortion system 400 and may be passed to input matching circuitry 105 in amplifier component 100. Once digital pre-distortion system 400 provides the hybrid distortion correcting signal to input matching circuitry 105 feeding amplifier 110 in stage 550, method 500 may then end at stage 560.

Figure 6:
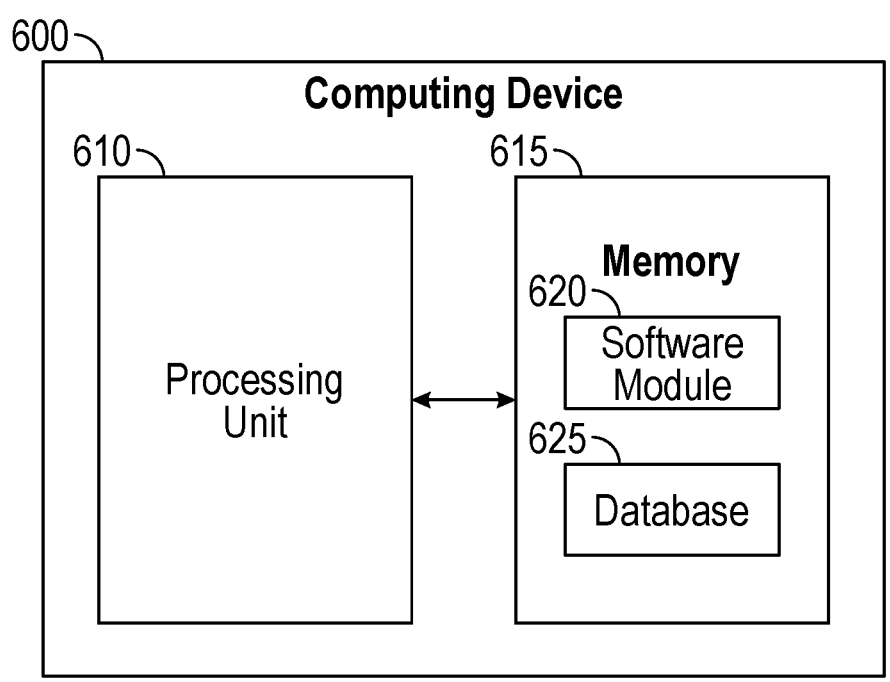
FIG. 6 is a block diagram of a computing device.

FIG. 6 shows computing device 600. As shown in FIG. 6, computing device 600 may include a processing unit 610 and a memory unit 615. Memory unit 615 may include a software module 620 and a database 625. While executing on processing unit 610, software module 620 may perform, for example, processes for providing digital pre-distortion, including for example, any one or more of the stages from method 200 described above with respect to FIG. 5. Computing device 600, for example, may provide an operating environment for any one or more of the elements shown in FIG. 4. Any one or more of the elements shown in FIG. 4 may operate in other environments and are not limited to computing device 600.

Computing device 600 may be implemented using a Wireless Fidelity (Wi-Fi) access point, a cellular base station, a tablet device, a mobile device, a smart phone, a telephone, a remote control device, a set-top box, a digital video recorder, a cable modem, a personal computer, a network computer, a mainframe, a router, a switch, a server cluster, a smart TV-like device, a network storage device, a network relay devices, or other similar microcomputer-based device. Computing device 600 may comprise any computer operating environment, such as hand-held devices, multiprocessor systems, microprocessor-based or programmable sender electronic devices, minicomputers, mainframe computers, and the like. Computing device 600 may also be practiced in distributed computing environments where tasks are performed by remote processing devices. The aforementioned systems and devices are examples and computing device 600 may comprise other systems or devices.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the components illustrated in FIG. 4 may be integrated onto a single integrated circuit. Such an SOC device may include one or more processing units, graphics units, communications units, system virtualization units and various application functionality all of which may be integrated (or "burned") onto the chip substrate as a single integrated circuit. When operating via an SOC, the functionality described herein with respect to embodiments of the disclosure, may be performed via application-specific logic integrated with other components of computing device 600 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:
   generating a radio frequency (RF) domain distortion correcting signal from an input signal, the generated RF domain distortion correcting signal corresponding to an amplifier;
   generating a base band (BB) domain distortion correcting signal from the input signal, the generated BB domain distortion correcting signal corresponding to the amplifier, wherein generating the BB domain distortion correction signal comprises:
      determining a BB domain characterization for input matching circuitry;
      determining an inverse of the BB domain characterization for the input matching circuitry;
      determining the BB domain characterization for non-linearity of the amplifier connected to the input matching circuitry; and
      generating the BB domain distortion correcting signal based on the determined BB domain characterization for the input matching circuitry, the determined inverse of the BB domain characterization for the input matching circuitry, and the determined BB domain characterization for the non-linearity of the amplifier connected to the input matching circuitry; and
   combining the RF domain distortion correcting signal and the BB domain distortion correcting signal to form a hybrid distortion correcting signal.

2. The method of claim 1, further comprising initializing the RF domain distortion correcting signal and the BB domain distortion correcting signal.

3. The method of claim 1, further comprising providing the hybrid distortion correcting signal to input matching circuitry feeding the amplifier.

4. The method of claim 3, wherein providing the hybrid distortion correcting signal to the input matching circuitry feeding the amplifier comprises providing the hybrid distortion correcting signal to the input matching circuitry feeding the amplifier wherein the amplifier is disposed in a Hybrid Fiber-Coaxial (HFC) network.

5. The method of claim 1, wherein generating the RF domain distortion correcting signal comprises determining an RF domain characterization for the input matching circuitry.

6. The method of claim 5, wherein generating the RF domain distortion correcting signal comprises determining an inverse of the RF domain characterization for the input matching circuitry.

7. The method of claim 6, wherein generating the RF domain distortion correcting signal comprises determining the RF domain characterization for non-linearity of the amplifier connected to the input matching circuitry.

8. The method of claim 7, wherein generating the RF domain distortion correcting signal comprises generating the RF domain distortion correcting signal based on the determined RF domain characterization for the input the matching circuitry, the determined inverse of the RF domain characterization for the input matching circuitry, and the determined RF domain characterization for the non-linearity of the amplifier connected to the input matching circuitry.

9. The method of claim 1, wherein generating the RF domain distortion correcting signal comprises generating the RF domain distortion correcting signal by a Radio Frequency Digital Pre-Distortion actuator.

10. The method of claim 1, wherein generating the BB domain distortion correcting signal comprises generating the BB domain distortion correcting signal by a Base Band Digital Pre-Distortion actuator.

11. A computer-readable medium that stores a set of instructions which when executed perform a method comprising:
  initializing a radio frequency (RF) domain distortion correcting signal and a base band (BB) domain distortion correcting signal;
  generating the RF domain distortion correcting signal from an input signal, the generated RF domain distortion correcting signal corresponding to an amplifier;
  generating the BB domain distortion correcting signal from the input signal, the generated BB domain distortion correcting signal corresponding to the amplifier, wherein generating the BB domain distortion correction signal comprises:
    determining a BB domain characterization for input matching circuitry,
    determining an inverse of the BB domain characterization for the input matching circuitry,
    determining the BB domain characterization for non-linearity of the amplifier connected to the input matching circuitry, and
    generating the BB domain distortion correcting signal based on the determined BB domain characterization for the input matching circuitry, the determined inverse of the BB domain characterization for the input matching circuitry, and the determined BB domain characterization for the non-linearity of the amplifier connected to the input matching circuitry;
  combining the RF domain distortion correcting signal and the BB domain distortion correcting signal to form a hybrid distortion correcting signal; and
  providing the hybrid distortion correcting signal to input matching circuitry feeding the amplifier.

12. The computer-readable medium of claim 11, wherein generating the RF domain distortion correcting signal comprises:
  determining an RF domain characterization for the input matching circuitry;
  determining an inverse of the RF domain characterization for the input matching circuitry;
  determining the RF domain characterization for non-linearity of the amplifier connected to the input matching circuitry; and
  wherein generating the RF domain distortion correcting signal comprises generating the RF domain distortion correcting signal based on the determined RF domain characterization for the input matching circuitry, the determined inverse of the RF domain characterization for the input matching circuitry, and the determined RF domain characterization for the non-linearity of the amplifier connected to the input matching circuitry.

13. The computer-readable medium of claim 11, wherein the instructions which when executed perform the method further comprising the initializing the RF domain distortion correcting signal and the BB domain distortion correcting signal.

14. The computer-readable medium of claim 11, wherein the instructions which when executed perform the method further comprising providing the hybrid distortion correcting signal to input matching circuitry feeding the amplifier.

15. The computer-readable medium of claim 14, wherein providing the hybrid distortion correcting signal to the input matching circuitry feeding the amplifier comprises providing the hybrid distortion correcting signal to the input matching circuitry feeding the amplifier wherein the amplifier is disposed in a Hybrid Fiber-Coaxial (HFC) network.

16. A system comprising:
  a memory storage; and
  a processing unit coupled to the memory storage, wherein the processing unit is operative to:
    initialize a radio frequency (RF) domain distortion correcting signal and a base band (BB) domain distortion correcting signal;
    generate the RF domain distortion correcting signal from an input signal, the generated RF domain distortion correcting signal corresponding to an amplifier;
    generate the BB domain distortion correcting signal from the input signal, the generated BB domain distortion correcting signal corresponding to the amplifier, wherein the processing unit being operative to generate the BB domain distortion correction signal comprises the processing unit being operative to:
      determine a BB domain characterization for input matching circuitry,
      determine an inverse of the BB domain characterization for the input matching circuitry,
      determine the BB domain characterization for non-linearity of the amplifier connected to the input matching circuitry, and
      generate the BB domain distortion correcting signal based on the determined BB domain characterization for the input matching circuitry, the determined inverse of the BB domain characterization for the input matching circuitry, and the determined BB domain characterization for the non-linearity of the amplifier connected to the input matching circuitry;
    combine the RF domain distortion correcting signal and the BB domain distortion correcting signal to form a hybrid distortion correcting signal; and provide the hybrid distortion correcting signal to input matching circuitry feeding the amplifier.

17. The system of claim 16, wherein the processing unit is further operative to:
- determine an RF domain characterization for the input matching circuitry;
- determine an inverse of the RF domain characterization for the input matching circuitry;
- determine the RF domain characterization for non-linearity of the amplifier connected to the input matching circuitry; and
- wherein the processing unit being operative to generate the RF domain distortion correcting signal comprises the processing unit being operative to generate the RF domain distortion correcting signal based on the determined RF domain characterization for the input matching circuitry, the determined inverse of the RF domain characterization for the input matching circuitry, and the determined RF domain characterization for the non-linearity of the amplifier connected to the input matching circuitry.

18. The system of claim 16, wherein the processing unit is further configured to initialize the RF domain distortion correcting signal and the BB domain distortion correcting signal.

19. The system of claim 16, wherein the processing unit is further operative to provide the hybrid distortion correcting signal to input matching circuitry feeding the amplifier.

20. The system of claim 19, wherein the processing unit being operative to provide the hybrid distortion correcting signal to the input matching circuitry feeding the amplifier comprises the processing unit being operative to provide the hybrid distortion correcting signal to the input matching circuitry feeding the amplifier wherein the amplifier is disposed in a Hybrid Fiber-Coaxial (HFC) network.

* * * * *